United States Patent
Banerjee et al.

(10) Patent No.: US 10,250,192 B2
(45) Date of Patent: *Apr. 2, 2019

(54) CLASS-E OUTPHASING POWER AMPLIFIER WITH EFFICIENCY AND OUTPUT POWER ENHANCEMENT CIRCUITS AND METHOD

(71) Applicant: TEXAS INSTRUMENTS INCORPORATED, Dallas, TX (US)

(72) Inventors: Aritra Banerjee, Dallas, TX (US); Joonhoi Hur, San Diego, CA (US); Baher Haroun, Allen, TX (US); Nathan Richard Schemm, Rowlett, TX (US); Rahmi Hezar, Allen, TX (US); Lei Ding, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/708,168

(22) Filed: Sep. 19, 2017

(65) Prior Publication Data
US 2018/0006609 A1    Jan. 4, 2018

Related U.S. Application Data

(63) Continuation of application No. 15/165,339, filed on May 26, 2016, now Pat. No. 9,806,673, which is a
(Continued)

(51) Int. Cl.
*H03F 3/217*    (2006.01)
*H03F 1/02*    (2006.01)
(Continued)

(52) U.S. Cl.
CPC ......... *H03F 1/0205* (2013.01); *H03F 1/0294* (2013.01); *H03F 3/193* (2013.01);
(Continued)

(58) Field of Classification Search
CPC ...... H03F 3/217; H03F 3/2173; H03F 3/2171; H03F 2200/432; H03F 2200/351;
(Continued)

(56) References Cited

U.S. PATENT DOCUMENTS 5,065,300 A * 11/1991 Jacobson .............. H02M 3/337
                                                          363/131
5,111,157 A    5/1992 Komiak
(Continued)

OTHER PUBLICATIONS

Raab, "Idealized Operation of the Class E Tuned Power Amplifier," IEEE Transactions on Circuits and Systems, vol. CAS-24, No. 12, Dec. 1977, pp. 725-735.
(Continued)

*Primary Examiner* — Khanh V Nguyen
(74) *Attorney, Agent, or Firm* — John R. Pessetto; Charles A. Brill; Frank D. Cimino

(57) ABSTRACT

An outphasing amplifier includes a first class-E power amplifier having an output coupled to a first conductor and an input receiving a first RF drive signal. A first reactive element is coupled between the first conductor and a second conductor. A second reactive element is coupled between the second conductor and a third conductor. A second class-E power amplifier includes an output coupled to a fourth conductor and an input coupled to a second RF drive signal, a third reactive element coupled between the second and fourth conductors. Outputs of the first and second power amplifiers are combined by the first, second and third reactive elements to produce an output current in a load. An efficiency enhancement circuit is coupled between the first and fourth conductors to improve power efficiency at back-off power levels. Power enhancement circuits are coupled to the first and fourth conductors, respectively.

4 Claims, 11 Drawing Sheets

Related U.S. Application Data continuation of application No. 14/312,239, filed on Jun. 23, 2014, now Pat. No. 9,385,669.

(51) Int. Cl.
  *H03F 3/193* (2006.01)
  *H03F 3/21* (2006.01)
  *H03F 3/45* (2006.01)

(52) U.S. Cl.
  CPC ........... *H03F 3/211* (2013.01); *H03F 3/2171* (2013.01); *H03F 3/2176* (2013.01); *H03F 3/45179* (2013.01); *H03F 3/217* (2013.01); *H03F 3/2173* (2013.01); *H03F 2200/391* (2013.01); *H03F 2200/451* (2013.01); *H03F 2203/21139* (2013.01); *H03F 2203/21142* (2013.01)

(58) Field of Classification Search
  CPC ........ H03F 2200/03; H03F 1/02; H03F 3/193; H03F 3/21
  USPC ................................ 330/124 R, 251, 286.295
  See application file for complete search history.

(56) References Cited

U.S. PATENT DOCUMENTS

| | | | |
|---|---|---|---|
| 5,274,341 A * | 12/1993 | Sekine | H03F 3/604 |
| | | | 330/269 |
| 5,726,603 A | 3/1998 | Chawla et al. | |
| 5,955,926 A | 9/1999 | Uda | |
| 6,816,011 B2 | 11/2004 | Paul et al. | |
| 7,786,797 B2 | 8/2010 | Okazaki et al. | |
| 8,174,322 B2 * | 5/2012 | Heijden | H03F 1/0294 |
| | | | 330/124 R |
| 8,274,330 B2 | 9/2012 | Paul | |
| 8,890,618 B2 * | 11/2014 | Pamarti | H03F 1/0294 |
| | | | 330/124 R |
| 9,419,561 B2 * | 8/2016 | Hur | H03F 1/0227 |
| 2004/0027199 A1 | 2/2004 | Wight et al. | |
| 2005/0083122 A1 | 4/2005 | Tayrani et al. | |
| 2012/0286868 A1 | 11/2012 | Haroun et al. | |
| 2013/0210376 A1 * | 8/2013 | Hur | H04B 1/0475 |
| | | | 455/91 |

OTHER PUBLICATIONS

Raab, "Efficiency of Outphasing RF Power-Amplifier Systems," IEEE Transactions on Communications, vol. Com-33, No. 10, Oct. 1985, pp. 1094-1099.

Kee, et al., "The Class-E/F Family of ZVS Switching Amplifiers," IEEE Transactions on Microwave Theory and Techniques, vol. 51, No. 6, Jun. 2003, pp. 1677-1690.

Hung, et al., "CMOS Outphasing Class-D Amplifier with Chireix Combiner," IEEE Microwave and Wireless Components Letters, vol. 17, No. 8, Aug. 2007, pp. 619-621.

Beltran, et al., "HF Outphasing Transmitter Using Class-E Power Amplifiers," IEEE, 2009, pp. 757-760.

Wongkomet, et al., "A +31.5 dBm CMOS RF Doherty Power Amplifier for Wireless Communications," IEEE Journal of Solid-STate Circuits, vol. 41, No. 12, Dec. 2006, pp. 2842-2859.

Hassan, et al., "A Wideband CMOS/GaAs HBT Envelope Tracking Power Amplifier for 4G LTE Mobile Terminal Applications," IEEE Transactions on Microwave Theory and Techniques, vol. 60, No. 5, May 2012, pp. 1321-1330.

* cited by examiner

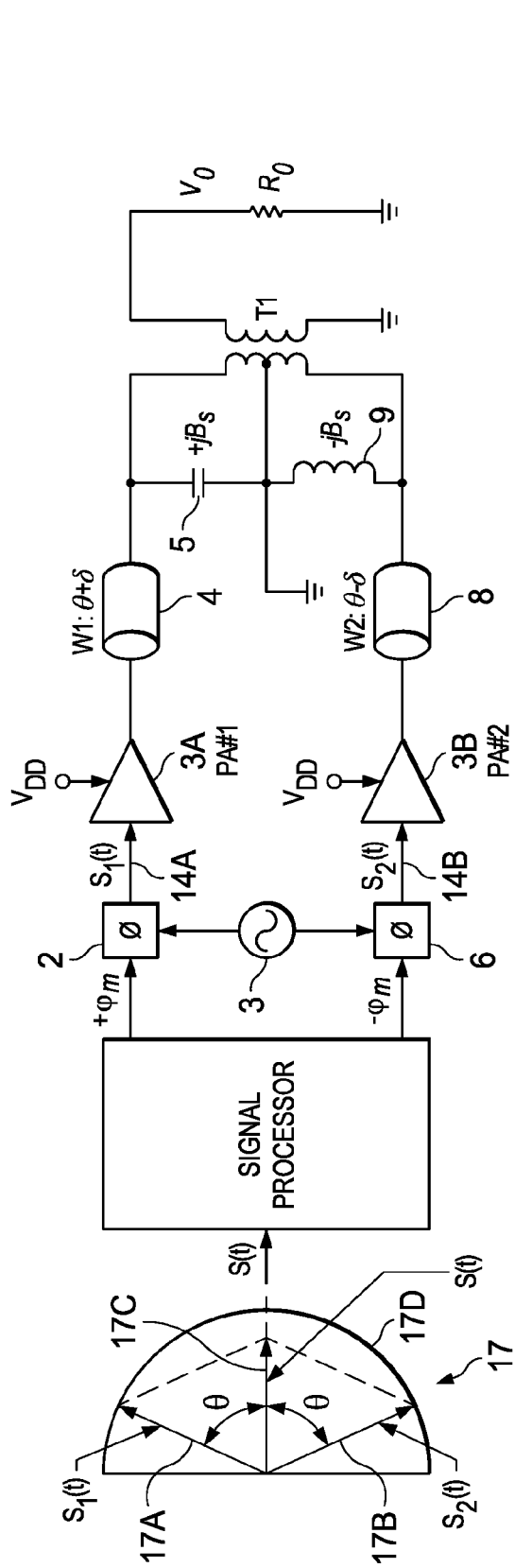
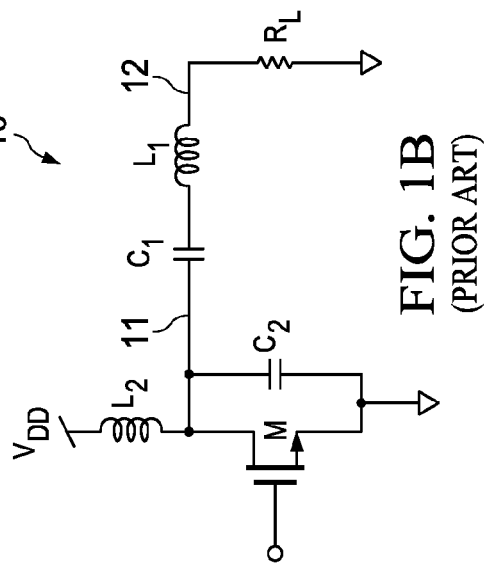
FIG. 1A (PRIOR ART)
FIG. 1B (PRIOR ART)

CLASS-E OUTPHASING POWER AMPLIFIER WITH EFFICIENCY AND OUTPUT POWER ENHANCEMENT CIRCUITS AND METHOD

CROSS REFERENCE TO RELATED APPLICATION(S)

This continuation application claims priority to U.S. patent application Ser. No. 15/165,339, filed May 26, 2016, which claims priority to U.S. patent application Ser. No. 14/312,239, filed Jun. 23, 2014, both applications of which are hereby incorporated herein by reference in their entirety.

BACKGROUND OF THE INVENTION

The present invention relates generally to improving back-off efficiency and peak output power level for class-E outphasing power amplifiers (PAs).

Modern wireless communication systems require advanced modulation techniques that result in non-constant envelope modulation and very high peak-to-average power ratio (PAPR) in the modulated RF signal. For such signals, linear power amplifiers quickly become less power efficient as the amount of load current demanded by a load decreases. The term "power back-off" is used to indicate the situation or condition when the instantaneous load power is low relative to the peak power that can be supplied to the load by the PA (power amplifier). Many techniques have been proposed in the past to improve the power efficiency of the power amplifiers as the load current decreases. The architecture described in the article by N. Wongkomet, L. Tee and P. R. Gray entitled "A +31.5 dBm CMOS RF Doherty Power Amplifier for Wireless Communications", IEEE Journal of Solid-State Circuits, Vol. 41, No. 12, pp. 2852-2859, December 2006 combines two power amplifiers biased in different operating point "regions" to reduce the power efficiency degradation. "Envelope tracking" (ET) and "envelope elimination and restoration" (EER) are two other efficiency improvement techniques which require a power supply control scheme. See the article by M. Hassan, L. E. Larson, V. W. Leung, D. F. Kimball and P. M. Asbeck entitled "A Wideband CMOS/GaAs HBT Envelope Tracking Power Amplifier for 4G LTE Mobile Terminal Applications", IEEE Transactions on Microwave Theory and Techniques, Vol. 60, No. 5, pp. 1321-1330, May 2012.

Outphasing, or linear amplification using nonlinear components (LINC), produces amplitude modulation of RF (radio frequency) output signals by combining the output of two power amplifiers that are driven by constant envelope (i.e., constant amplitude) phase modulated signals. Outphasing power amplifier configurations also have been reported using switching power amplifiers such as class D and class-E amplifiers. See the article by Frederick Raab entitled "Efficiency of Outphasing RF Power-Amplifier Systems", IEEE Transactions on Communications, Vol. 33, No. 10, pp. 1094-1099, October 1985 and the article by T. Hung, D. K. Choi, L. E. Larson, P. M. Asbeck entitled "CMOS Outphasing Class-D Amplifier With Chireix Combiner", IEEE Microwave and Wireless Components Letters, Vol. 17, No. 8, pp. 619-621, August 2007. The outphasing configuration of class-E power amplifiers (PAs) with an asymmetric transmission line combiner is shown in Prior Art FIG. 1A. See the article by R. Beltran, F. H. Raab, A. Velazquez, "HF outphasing transmitter using class-E power amplifiers," IEEE MTT-S International Microwave Symposium, pp. 757-760, June 2009.

"Prior Art" FIG. 1A shows an outphasing transmitter which produces a variable amplitude output by varying the phases of the driving signals to its RF-power amplifiers. The phase modulation causes the instantaneous vector sum of outputs of the two PAs to follow a desired signal envelope amplitude. Outphasing is attractive because signal phase can easily be modulated over a wide bandwidth, and constant envelope signals on individual paths allow the use of switch mode power amplifiers which have higher efficiency than linear power amplifiers. In a microwave implementation, power combiners based upon transmission lines are often used. The outphasing transmitter, also known as a "linear amplification using non-linear components" (LINC) transmitter, was originally developed to provide linear amplification with active devices that have poor linearity. Chireix added complementary shunt reactances at the inputs of the combiner to improve the efficiency at certain power back-off levels.

Prior Art FIG. 1A also shows a vector diagram to illustrate a conventional way of generating the phase modulated RF drive signals $S_1(t)$ and $S_2(t)$ that can be used in the subsequently described embodiments of the present invention. FIG. 1A generally indicates how the drive signals $S_1(t)$ and $S_2(t)$ are generated in a basic outphasing system. (The basic outphasing technique is described in the above mentioned article "Efficiency of Outphasing RF Power-Amplifier Systems" by F. Raab.) In FIG. 1A, drive signals $S_1(t)$ and $S_2(t)$ are generated in response to the incoming amplitude and phase modulated signal S(t) represented by the vector 17C. Drive signals $S_1(t)$ and $S_2(t)$ are represented by vectors 17A and 17B, respectively. Specifically, in the outphasing power amplifier the incoming signal with amplitude and phase modulation $$S(t)=a(t)e^{j\phi(t)}$$

is decomposed into two constant envelope phase modulated signals $S_1(t)$ and $S_2(t)$ on conductors 14A and 14B in FIG. 1A, respectively, as $$S_{1,2}(t)=Ae^{j[\phi(t)\pm\theta(t)]}$$

where $$\theta(t)=\cos^{-1}[a(t)/(2A)]$$

and the constant amplitude A is defined as the maximum of a(t)/2, where φ(t) is the phase of the original amplitude and phase modulated signal S(t). The constant amplitude envelopes of signals $S_1(t)$ and $S_2(t)$ allow the use of switched-mode implementations of power amplifiers 3A and 3B, respectively.

Referring next to Prior Art FIG. 1B, basic class-E switching power amplifiers consist of a capacitor shunting the transistor, a series tuned load network, and a choke inductor as shown. The term "class E" refers to a tuned power amplifier composed of a single-pole switch and a load network. The switch consists of a transistor M that is driven ON and OFF at the carrier frequency of the signal to be amplified. In its most basic form, the load network consists of a resonant circuit in series with the load, and a capacitor which shunts the switch. The total shunt capacitance is due to the output capacitance that is inherent in switching transistor M plus any extra capacitance coupled in parallel to the switch. The drain voltage waveform on conductor 11 is then determined by the switch transistor M when it is ON, and by the transient response of the load network when switch transistor M is OFF. See the article Frederick Raab entitled "Idealized operation of the class E tuned power amplifier", IEEE Transactions on Circuits and Systems, Vol. 24, No. 12, pp. 725-735, December 1977.

Outphasing power amplifier configurations have been reported using switching power amplifiers such as class-D and class-E switching power amplifiers. See the article by T. Hung, D. K. Choi, L. E. Larson, P. M. Asbeck entitled "CMOS Outphasing Class-D Amplifier With Chireix Combiner", IEEE Microwave and Wireless Components Letters, Vol. 17, No. 8, pp. 619-621, August 2007 and the article the article R. Beltran, F. H. Raab, A. Velazquez, "HF outphasing transmitter using class-E power amplifiers," IEEE MTT-S International Microwave Symposium, pp. 757-760, June 2009.

Commonly assigned published patent application Pub. No. 2013/0210376 entitled "LINC Transmitter with Improved Efficiency" by Hur et al., published Aug. 15, 2013, discloses a LINC transmitter including class-D power amplifiers with combiner circuitry having improved efficiency.

Conventional or "traditional" RF power amplifiers suffer from loss of power efficiency, i.e., power delivered by the amplifier to the load divided by total power consumed by the power amplifier, as the amount of instantaneous load power decreases. In handheld devices, low power efficiency of the RF power amplifiers causes shorter battery lifetimes, and in base station applications the low power efficiency of the RF power amplifiers may result in wasted power and high heat sinking costs.

A problem of the prior art is that the need for high data rates and efficient spectrum utilization in modern wireless communication systems results in high peak-power-to-average-power ratios of modulated signals therein. This requires associated RF power amplifiers to operate much of the time at greatly reduced output power levels, corresponding to high levels of "power back-off" operation.

Another problem of the prior art is achieving high output power levels from the power amplifiers without exceeding transistors' maximum voltage specifications in the integrated circuit.

Techniques for adding a third harmonic component and other harmonic components to the signal on the drain terminal of a switching transistor of a class-E power amplifier for the case of a non-outphasing "static power amplifier" is known. See the article by S. D. Kee, I. Aoki, A. Hajimiri, D. Rutledge entitled "The class-E/F family of ZVS switching amplifiers", IEEE Transactions on Microwave Theory and Techniques, Vol. 51, No. 6, pp. 1677-1690, June 2003. The prior techniques show addition of harmonic components to allow switching operations, as in class-E power amplifiers, with reduced peak drain voltage. Although the foregoing Kee et al. article discloses using additional third harmonic signal components to shift the drain voltage of a class-E power amplifier, it discloses use of this technique only in a single static (i.e., for a single value of phase angle θ) class-E power amplifier, by adding third harmonic component to shift the amplifier switching transistor's drain voltage.

Thus, there is an unmet need for a way of increasing the power efficiency of a class-E outphasing power amplifier.

There also is an unmet need for a way of increasing the power efficiency of a class-E outphasing power amplifier over a range of power back-off conditions.

There also is an unmet need for a way of increasing the peak output power of a class-E outphasing power amplifier by increasing the amplifier's power supply voltage without violating transistor reliability limits.

There also is an unmet need for a way of increasing the power efficiency over a range of power back-off conditions and the maximum peak output power of a class-E outphasing power amplifier by increasing the amplifier's power supply voltage without violating transistor reliability limits utilizing various alternative combiner circuit configurations.

There also is an unmet need for a way of providing simplified combiner circuitry for a class-E outphasing power amplifier.

There also is an unmet need for an improved way of providing a class-E outphasing power amplifier without use of a quarter-wavelength transmission line combiner.

SUMMARY OF THE INVENTION

It is an object of the invention to provide a way of increasing the power efficiency of a class-E outphasing power amplifier.

It is another object of the invention to provide a way of increasing the power efficiency of a class-E outphasing power amplifier over a range of power back-off conditions.

It is another object of the invention to provide a way of increasing the peak output power of a class-E outphasing power amplifier by increasing the amplifier's power supply voltage without violating transistor reliability limits.

It is another object of the invention to provide a reliable way of increasing the maximum peak output power of a class-E outphasing power amplifier by increasing the amplifier's power supply voltage.

It is another object of the invention to provide a way of increasing the power efficiency over a range of power back-off conditions and of increasing the peak output power of a class-E outphasing power amplifier by increasing the amplifier's power supply voltage utilizing various alternative combiner circuit configurations.

It is another object of the invention to provide simplified combiner circuitry for a class-E outphasing power amplifier.

It is another object of the invention to provide an improved class-E outphasing power amplifier without use of a quarter-wavelength transmission line combiner.

Briefly described, and in accordance with one embodiment, the present invention provides an outphasing amplifier which includes a first class-E power amplifier (16-1) having an output coupled to a first conductor (31-1) and an input receiving a first RF drive signal ($S_1(t)$). A first reactive element ($C_A$-1) is coupled between the first conductor and a second conductor (30-1). A second reactive element ($L_A$-1) is coupled between the second conductor and a third conductor (32-1). A second class-E power amplifier (17-1) includes an output coupled to a fourth conductor (31-2) and an input coupled to a second RF drive signal ($S_2(t)$), a third reactive element ($C_A$-3) coupled between the second and fourth conductors. Outputs of the first and second power amplifiers are combined by the first, second and third reactive elements to produce an output current in a load (R). An efficiency enhancement circuit ($L_{EEC}$-1) is coupled between the first and fourth conductors to improve power efficiency at back-off power levels. Power enhancement circuits (20-1,2) are coupled to the first and fourth conductors, respectively.

In one embodiment, the invention provides an outphasing amplifier (15) including a first class-E power amplifier (16-1) having an output coupled to a first conductor (31-1) and an input coupled to a first RF drive signal ($S_1(t)$, a first reactive circuit element ($C_A$-1 in FIG. 2A or $L_A$-1 in FIG. 5) coupled between the first conductor (31-1) and a second conductor (30-1) and a second reactive circuit element ($L_A$-1 in FIG. 2A or $C_A$-1 in FIG. 5) coupled between the second conductor (30-1) and a third conductor (32-1). The second class-E power amplifier (17-1) has an output coupled to a fourth conductor (31-2) and an input coupled to a second RF drive signal ($S_2(t)$) and a third reactive circuit element ($C_A$-3 in FIG. 2A or $L_A$-3 in FIG. 5) coupled between the fourth conductor (31-2) and the second conductor (30-1). The third conductor (32-1) is coupled to a first terminal of a load (R). Outputs of the first (16-1) and second (17-1) class-E power amplifiers are combined by means of the first ($C_A$-1 in FIG. 2A or $L_A$-1 in FIG. 5), second ($L_A$-1 in FIG. 2A or $C_A$-1 in FIG. 5), and third ($C_A$-3 in FIG. 2A or $L_A$-3 in FIG. 5) reactive elements to produce an output current in a load (R). In one embodiment, first efficiency enhancement circuitry ($L_{EEC}$-1 in FIG. 2A, $Z_{EEC}$-1 in FIG. 5) is coupled between the first (31-1) and fourth (31-2) conductors for causing power efficiency improvement at back-off power levels. In one embodiment, first power enhancement circuitry (20-1) is coupled between the first conductor (31-1) and a fifth conductor (31-3 in FIG. 2A or GND (ground) in FIG. 2B) conductor and second power enhancement circuitry (20-2) coupled between the fourth conductor (31-2) and an eighth conductor (31-4 in FIG. 2A or GND in FIG. 2B).

In one embodiment, the outphasing amplifier includes a third class-E power amplifier (16-2) having an output coupled to a fifth conductor (31-3) and an input coupled to a third RF drive signal ($S_1'(t)$), a fourth reactive circuit element ($C_A$-2 in FIG. 2A or $L_A$-2 in FIG. 5) coupled between the fifth conductor (31-3) and a sixth conductor (30-2) and a fifth reactive circuit element ($L_A$-2 in FIG. 2A or $C_A$-2 in FIG. 5) coupled between the sixth conductor (30-2) and a seventh conductor (32-2). A fourth class-E power amplifier (17-2) has an output coupled to an eighth conductor (31-4) and an input coupled to a fourth RF drive signal ($S_2'(t)$) and a sixth reactive circuit element ($C_A$-4 in FIG. 2A or $L_A$-4 in FIG. 5) coupled between the eighth conductor (31-4) and the sixth conductor (30-2). The seventh conductor (32-2) is coupled to a second terminal of the load (R). The third ($S_1'(t)$) and fourth ($S_2'(t)$) RF drive signals are the inverse signals or complements of the first ($S_1(t)$ and second ($S_2(t)$) RF drive signals, respectively. In one embodiment, first efficiency enhancement circuitry ($L_{EEC}$-1 in FIG. 2A, $Z_{EEC}$-1 in FIG. 5) is coupled between the first (31-1) and fourth (31-2) conductors for causing power efficiency improvement at back-off power levels, and second efficiency enhancement circuitry ($L_{EEC}$-2 in FIG. 2A, $Z_{EEC}$-2 in FIG. 5) is coupled between the fifth (31-3) and eighth (31-4) conductors for causing power efficiency improvement at back-off power levels. In one embodiment, first power enhancement circuitry (20-1) is coupled between the first conductor (31-1) and the fifth conductor (31-3) and second power enhancement circuitry (20-2) is coupled between the fourth conductor (31-2) and the eighth conductor (31-4).

In one embodiment, the power amplifier includes first efficiency enhancement circuitry ($L_{EEC}$-1 in FIG. 2A, $Z_{EEC}$-1 in FIG. 5) coupled between the first (31-1) and fourth (31-2) conductors for causing power efficiency improvement at back-off power levels, and also includes first power enhancement circuitry (20-1) coupled between the first conductor (31-1) and a fifth conductor (e.g., 31-3 in FIG. 2A or GND in FIG. 2B) and second power enhancement circuitry (20-2) coupled between the fourth conductor (31-2) and an eighth conductor (e.g., 31-4 in FIG. 2A or GND in FIG. 2B).

In one embodiment, each class-E power amplifier (16-1, 17-1) includes an N-channel switching transistor ($M_1$ or $M_3$) having a source coupled to a reference voltage conductor (GND), a gate coupled to the input of that class-E power amplifier (16-1, 17-1), and a drain coupled to one of the first (31-1) and fourth (31-2) conductors, and a corresponding inductor ($L_C$). In one embodiment, the first efficiency enhancement circuitry ($L_{EEC}$-1 in FIG. 2A, $Z_{EEC}$-1 in FIG. 5) includes an inductor ($L_{EEC}$-1) coupled between the first (31-1) and fourth (31-2) conductors and each of the first power enhancement circuitry (20-1) and second power enhancement circuitry (20-2) includes a first inductor ($L_{PEC}$) and a first capacitor ($C_{PEC}$) coupled in series.

In one embodiment, the first inductor ($L_{PEC}$) and the first capacitor ($C_{PEC}$) operate to add a harmonic signal to the output of a corresponding class-E power amplifier (16-1 or 17-1) to shape the output of that class-E power amplifier across all phase angles (θ) between the first ($S_1(t)$) and second ($S_2(t)$) RF drive signals so as to increase the maximum peak output power that can be safely delivered by the outphasing amplifier (15) to the load (R).

In one embodiment, in each class-E power amplifier (16-1, 17-1) the drain of the N-channel switching transistor ($M_1$ or $M_3$) is coupled by means of a corresponding N-channel cascode transistor ($N_1$ or $N_3$) to the one of the first (31-1) and fourth (31-2) conductors and a corresponding inductor ($L_C$). In one embodiment, at least one of the capacitors is tunable.

In one embodiment, the first reactive circuit element ($C_A$-1 in FIG. 2A or $L_A$-1 in FIG. 5) is included in circuitry which also performs an efficiency enhancement function.

In one embodiment, the invention includes a method for providing an outphasing power amplifier (15) including a first class-E power amplifier (16-1) having an output coupled to a first conductor (31-1) and an input coupled to a first RF drive signal ($S_1(t)$) and a second class-E power amplifier (17-1) having an output coupled to a fourth conductor (31-2) and an input coupled to a second RF drive signal ($S_2(t)$), the method including combining output signals produced by the first (16-1) and second (17-1) power amplifiers by coupling a first reactive circuit element ($C_A$-1 in FIG. 2A or $L_A$-1 in FIG. 5) between the first conductor (31-1) and a second conductor (30-1); coupling a second reactive circuit element ($L_A$-1 in FIG. 2A or $C_A$-1 in FIG. 5) between the second conductor (30-1) and a third conductor (32-1); and coupling a third reactive circuit element ($C_A$-3 in FIG. 2A or $L_A$-3 in FIG. 5) between the fourth conductor (31-2) and the second conductor (30-1), to produce an output current in a load (R).

In one embodiment, the method includes coupling first efficiency enhancement circuitry ($L_{EEC}$-1 in FIG. 2A, $Z_{EEC}$-1 in FIG. 5) between the first (31-1) and fourth (31-2) conductors to cause power efficiency improvement at back-off power levels.

In one embodiment, the method includes coupling first power enhancement circuitry (20-1) coupled between the first conductor (31-1) and a fifth conductor (31-3 in FIG. 2A or GND in FIG. 2B) and coupling second power enhancement circuitry (20-2) between the fourth conductor (31-2) and an eighth conductor (31-4 in FIG. 2A or GND in FIG. 2B) to add a harmonic signal to the output of a corresponding class-E power amplifier (16-1 or 17-1) to shape the output of that class-E power amplifier across all phase angles (t)) between the first ($S_1(t)$) and second ($S_2(t)$) RF drive signals so as to increase the peak output power that can be safely delivered by the outphasing amplifier (15) to the load (R).

In one embodiment, the method includes performing an efficiency enhancement function by means of the first reactive circuit element ($C_A$-1 in FIG. 2A or $L_A$-1 in FIG. 5).

In one embodiment, each of the first power enhancement circuitry (20-1) and second power enhancement circuitry (20-2) includes a first inductor ($L_{PEC}$) and a tunable first capacitor ($C_{PEC}$) coupled in series, and the method includes adjusting the tunable first capacitors ($C_{PEC}$) to adjust the frequency of the harmonic signal.

In one embodiment, the invention provides an outphasing amplifier (15) including a first class-E power amplifier (16-1) having an output coupled to a first conductor (31-1) and an input coupled to a first RF drive signal ($S_1(t)$) and a second class-E power amplifier (17-1) having an output coupled to a fourth conductor (31-2) and an input coupled to a second RF drive signal ($S_2(t)$); means (e.g., $C_A$-1,$C_A$-3, $L_A$-1) for combining output signals produced by the first (16-1) and second (17-1) power amplifiers by coupling the first reactive circuit element ($C_A$-1 in FIG. 2A) between the first conductor (31-1) and a second conductor (30-1), coupling a second reactive circuit element ($L_A$-1 in FIG. 2A) between the second conductor (30-1) and a third conductor (32-1), and coupling a third reactive circuit element ($C_A$-3 in FIG. 2A) between the fourth conductor (31-2) and the second conductor (30-1), to produce an output current in a load (R); means ($L_{EEC}$-1,2) for providing power efficiency improvement outphasing power amplifier (15) at back-off power levels by coupling first efficiency enhancement circuitry ($L_{EEC}$-1 in FIG. 2A, $Z_{EEC}$-1 in FIG. 5) between the first (31-1) and fourth (31-2) conductors; and means (20-1,2) for increasing the peak output power that can be safely delivered by the outphasing amplifier (15) to the load (R) by coupling first power enhancement circuitry (20-1) between the first conductor (31-1) and a fifth conductor (31-3 in FIG. 2A or GND in FIG. 2B) and coupling second power enhancement circuitry (20-2) between the fourth conductor (31-2) and an eighth conductor (31-4 in FIG. 2A or GND in FIG. 2B) to add a harmonic signal to the output of a corresponding class-E power amplifier (16-1 or 17-1) to shape the output of that class-E power amplifier across all phase angles (θ) between the first ($S_1(t)$) and second ($S_2(t)$) RF drive signals so as to reduce the peak drain voltage.

BRIEF DESCRIPTION OF THE DRAWINGS

FIG. 1A is a schematic drawing of a conventional outphasing amplifier with class E power amplifiers and asymmetric transmission line combiners.
FIG. 1B is a schematic diagram of a conventional class-E switching amplifier.

DETAILED DESCRIPTION OF THE PREFERRED EMBODIMENTS

The embodiments of the invention described below provide class-E power amplifier circuits and associated combiner circuits for use in an outphasing transmitter to improve back-off power efficiency and to improve output power levels. This is accomplished by providing passive combining network circuitry along with additional efficiency enhancement circuits and power enhancement circuits.

Figure 2A:
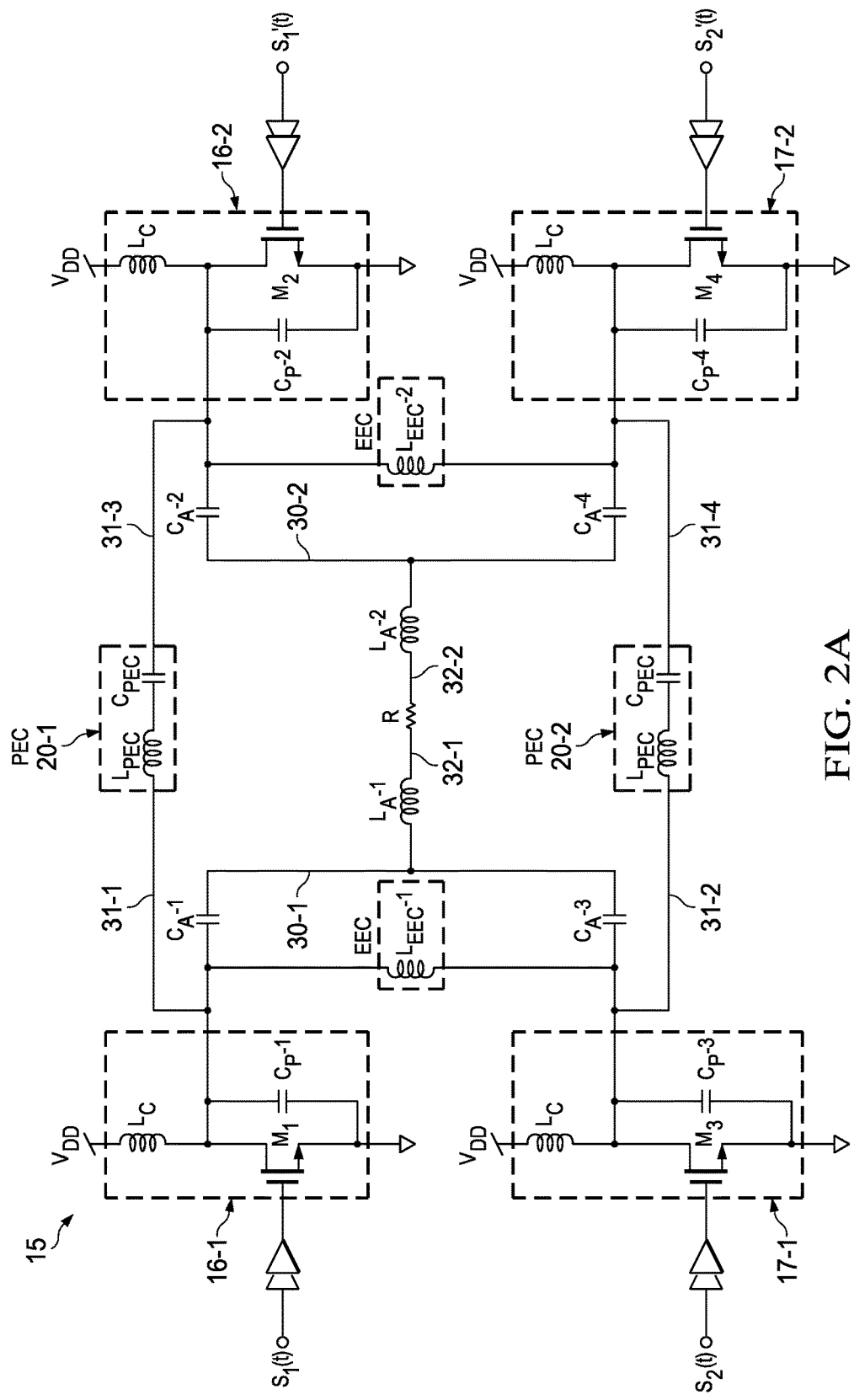
FIG. 2A is a schematic diagram illustrating a differential class-E outphasing power amplifier having a combiner that includes efficiency enhancement circuitry and a power enhancement circuitry.

FIG. 2A shows an outphasing power amplifier 15 that includes four Class-E power amplifiers in which four N-channel switching transistors $M_1$, $M_2$, $M_3$ and $M_4$ are driven by RF outphasing signals $S_1(t)$, $S_1'(t)$, $S_2(t)$, and $S_2'(t)$, respectively. RF signals $S_1'(t)$ and $S_2'(t)$ are the complementary or inverse signals of $S_1(t)$ and $S_2(t)$, respectively. RF drive signals $S_1(t)$ and $S_2(t)$ are rectangular, constant-amplitude, phase modulated waveforms that are generated from the amplitude and phase modulated RF signal S(t). Inductors $L_C$ connect the switching transistors $M_1$, $M_2$, $M_3$ and $M_4$, respectively, to the supply voltage $V_{DD}$. In a "traditional" class-E power amplifier design (see FIG. 1B), choke inductors having very high values of inductance are used, but in the design of FIG. 2A the inductors $L_C$ may have much smaller inductance. Capacitors $C_P$-1, $C_P$-2, $C_P$-3, and $C_P$-4 are connected in parallel with the switching transistors $M_1$, $M_2$, $M_3$ and $M_4$, respectively, and represent separate capacitances and/or drain-to-source parasitic capacitances of switching transistors $M_1$, $M_2$, $M_3$ and $M_4$. Capacitors $C_A$-1, $C_A$-2, $C_A$-3, and $C_A$-4 and inductors $L_A$-1 and $L_A$-2 form output matching and signal-combining circuitry tuned for class-E operation at the fundamental carrier frequency of the RF drive signals. Outphasing power amplifier 15 drives a load resistor R.

More specifically, class-E power amplifier 16-1 of outphasing power amplifier 15 in FIG. 2A receives the RF drive signal $S_1(t)$ which is applied to the input of class-E power amplifier 16-1. Class-E power amplifier 16-1 includes an N-channel MOS switching transistor $M_1$, an inductor $L_C$, and capacitor $C_P$-1. (Capacitor $C_P$-1 can be the output capacitance of class-E power amplifier 16-1 or a parallel combination of the output capacitance of that power amplifier and an external capacitance.) The gate of switching transistor $M_1$ is coupled to receive RF drive signal $S_1(t)$ through a driver circuit. The source of switching transistor $M_1$ is connected to ground, and its drain is connected by a conductor 31-1 to one terminal of choke inductor $L_C$, one terminal of capacitor $C_P$-1, one terminal of a capacitor $C_A$-1, one terminal of a power enhancement circuit 20-1, and to one terminal of an efficiency enhancement circuit (such as one including the subsequently described $L_{EEC}$ or $Z_{EEC}$ elements). The other terminal of inductor $L_C$ is connected to a power supply voltage $V_{DD}$. The other terminal of capacitor $C_A$-1 is connected to conductor 30-1. ePower enhancement circuit 20-1 includes an inductor $L_{PEC}$ and a capacitor $C_{PEC}$ connected in series between conductors 31-1 and 31-3. The efficiency enhancement circuit includes an inductor $L_{EEC}$-1 connected between conductors 31-1 and 31-2.

Similarly, outphasing power amplifier 15 also receives another RF drive signal $S_1'(t)$ which is the complement of RF drive signal $S_1(t)$. A class-E power amplifier 16-2 includes an N-channel MOS switching transistor $M_2$, an inductor $L_C$, and a capacitor $C_P$-2. The gate of switching transistor $M_2$ is coupled to receive RF drive signal $S_1'(t)$ through a driver circuit. The source of switching transistor $M_2$ is connected to ground, and its drain is connected by conductor 31-3 to one terminal of inductor $L_C$, one terminal of capacitor $C_P$-2, one terminal of a capacitor $C_A$-2, one terminal of an efficiency enhancement circuit including inductor $L_{EEC}$-2, and to one terminal of power enhancement circuit 20-1. The other terminal of inductor $L_C$ is connected to power supply voltage $V_{DD}$. The other terminal of capacitor $C_A$-2 is connected to conductor 30-2.

Outphasing power amplifier 15 also receives the RF drive signal $S_2(t)$, which is applied to the input of a class-E power amplifier 17-1. Class-E power amplifier 17-1 includes an N-channel MOS switching transistor $M_3$, an inductor $L_C$, and a capacitor $C_P$-3. The gate of switching transistor $M_3$ is coupled to receive RF drive signal $S_2(t)$ through a driver circuit. The source of switching transistor $M_3$ is connected to ground, and its drain is connected by a conductor 31-2 to one terminal of inductor $L_C$, one terminal of capacitor $C_P$-3, one terminal of a capacitor $C_A$-3, one terminal of the efficiency enhancement circuit including inductor $L_{EEC}$-1, and to one terminal of a power enhancement circuit 20-2. The other terminal of inductor $L_C$ is connected to power supply voltage $V_{DD}$. The other terminal of capacitor $C_A$-3 is connected to conductor 30-1. Power enhancement circuit 20-2 includes an inductor $L_{PEC}$ and a capacitor $C_{PEC}$ connected in series between conductors 31-2 and 31-4. The efficiency enhancement circuit including inductor $L_{EEC}$-1 thus is connected between conductors 31-1 and 31-2.

Outphasing power amplifier 15 receives yet another RF drive signal $S_2'(t)$, which is applied to the input of a class-E power amplifier 17-2. Class-E power amplifier 17-2 includes an N-channel MOS switching transistor $M_4$, an inductor $L_C$, and a capacitor $C_P$-4. The gate of switching transistor $M_4$ is coupled to receive RF drive signal $S_2'(t)$ through a driver circuit. The source of switching transistor $M_4$ is connected to ground, and its drain is connected by conductor 31-4 to one terminal of inductor $L_C$, one terminal of capacitor $C_P$-4, one terminal of a capacitor $C_A$-4, one terminal of an efficiency enhancement circuit, and to the other terminal of power enhancement circuit 20-2. The other terminal of inductor $L_C$ is connected to power supply voltage $V_{DD}$. The other terminal of capacitor $C_A$-4 is connected to conductor 30-2. The efficiency enhancement circuit includes inductor $L_{EEC}$-2 which is connected between conductors 31-3 and 31-4.

The inductors $L_{EEC}$-1 and $L_{EEC}$-2 form the efficiency enhancement circuits and are designed to improve the efficiency of the power amplifier under power back-off conditions, hereinafter referred to as the power amplifier being "at power back-off". (The power back-off is a conventional way of indicating how much less power a power amplifier is presently delivering to its load compared to the maximum amount of power the power amplifier could safely deliver to the load.) An inductor $L_{PEC}$ and a capacitor $C_{PEC}$ form each of power enhancement circuits 20-1 and 20-2 in order to increase the peak output power that outphasing power amplifier 15 can safely supply to the load resistor R without damaging the transistors.

Efficiency Enhancement Circuitry:

The purpose of efficiency enhancement circuits $L_{EEC}$-1 and $L_{EEC}$-2 is to improve the power efficiency of outphasing power amplifier 15 at power back-off. When the load power is less than the peak power due to applying a value of phase angle θ greater than zero between RF drive signals $S_1(t)$ and $S_2(t)$, the power efficiency of a traditional outphasing power amplifier rapidly falls from its maximum value as θ increases.

It should be understood that the in-phase components of the RF drive signals $S_1(t)$ and $S_2(t)$ contribute to the amount of power being delivered to load resistor R, but the out-of-phase components of RF drive signals $S_1(t)$ and $S_2(t)$ contribute to power dissipation in the circuit, and this results in a reduction in the power efficiency of outphasing power amplifier 15. The in-phase components of RF drive signals $S_1(t)$ and $S_2(t)$ cause the drain voltages of the switching transistors (or associated cascode transistors) connected to the opposite terminals of efficiency enhancement circuit $L_{EEC}$-1 or $L_{EEC}$-2 to be equal, so no RF current flows through efficiency enhancement circuit $L_{EEC}$-1 or $L_{EEC}$-2. However, for the out-of-phase components of the RF drive signals $S_1(t)$ and $S_2(t)$ the conductors 30-1 and 30-2 behave like a virtual ground and the $L_{EEC}$ inductors with the $C_P$ and $C_A$ capacitors form parallel resonant circuits and present very high impedance for the out-of-phase components at the carrier frequency. This high impedance of the parallel resonant circuit reduces the out-of-phase current, and this causes a reduction in the amount of power dissipation due to the out-of-phase current components. Use of efficiency enhancement circuits $L_{EEC}$-1 and $L_{EEC}$-2 therefore improves the power efficiency of outphasing power amplifier 15 at back-off power levels.

Power Enhancement Circuitry:

Note that the permissible $V_{DD}$ level applied to the outphasing power amplifier 15 depends on the source-to-drain breakdown voltages of switching transistors $M_1$, $M_2$, $M_3$ and $M_4$ (and associated cascode transistors if they are being used), and also note that the permissible $V_{DD}$ level determines how much the peak load current (and peak power) can be safely delivered to the load resistor R without damaging the switching transistors (or cascode transistors). Consequently, an increase in the peak load current and peak load power cannot be achieved by simply increasing the $V_{DD}$ level.

The switching on and off of a particular power amplifier switch transistor, e.g., switching transistor $M_1$, at the fundamental frequency results in a sinusoidal voltage signal at the fundamental frequency on the drain of that switch transistor (or the drain of an associated cascode transistor if one is being used) when the switch transistor is turned off. The power enhancement circuitry operates to add a third harmonic (and/or possibly other harmonics) of the carrier frequency in such a way that the peak drain voltage is reduced.

Each of the power enhancement circuits 20-1 and 20-2 includes a series-connected combination of an inductor $L_{PEC}$ and a capacitor $C_{PEC}$ which can be tuned to the third harmonic of the fundamental RF frequency (although other harmonics could be used). The third harmonic signal current is added to the drain of the switching transistor (or cascode transistor, if used) to which that power enhancement circuit 20-1 or 20-2 is connected. The result of the added third harmonic signal current is to "shape" or "flatten" the drain voltages of the switching transistors (as in FIG. 2A and FIG. 5-12), or to shape/flatten the drain voltages of the cascode transistors (as in FIG. 3), of the class-E power amplifiers in such a way that the maximum peak drain voltages are significantly reduced across all phase angles between RF drive signals $S_1(t)$ and $S_2(t)$. The reduced drain voltages allow the power supply voltage $V_{DD}$ to be significantly increased without damaging the switching transistors or cascode transistors by exceeding their drain-to-source voltage reliability limits. The increased value of $V_{DD}$ increases the peak output power that can be delivered to the load R by each class-E power amplifier and therefore increases the total peak output current/power that can be delivered to load R by outphasing power amplifier 15.

When the phase angle θ between the RF drive vectors $S_1(t)$ and $S_2(t)$ indicated in FIG. 1A changes with respect to time, this causes the drain voltages of the various power switching transistors (or cascode transistors, if used) to also change. The values of $L_{PEC}$ and $C_{PEC}$ are selected such that the third harmonic signal current is added to the fundamental frequency current in such a way as to decrease the switching transistor peak drain voltage not only at a particular value of phase angle θ but the maximum drain voltage is reduced across all possible values of θ between the $S_1(t)$ and $S_2(t)$ input signal vectors.

Note that this is in direct contrast to the harmonic circuitry shown in the above mentioned paper by S. D. Kee et al., in which the drain voltage is shaped in a static class-E PA without any phase modulation as in outphasing operation.

Figure 3:
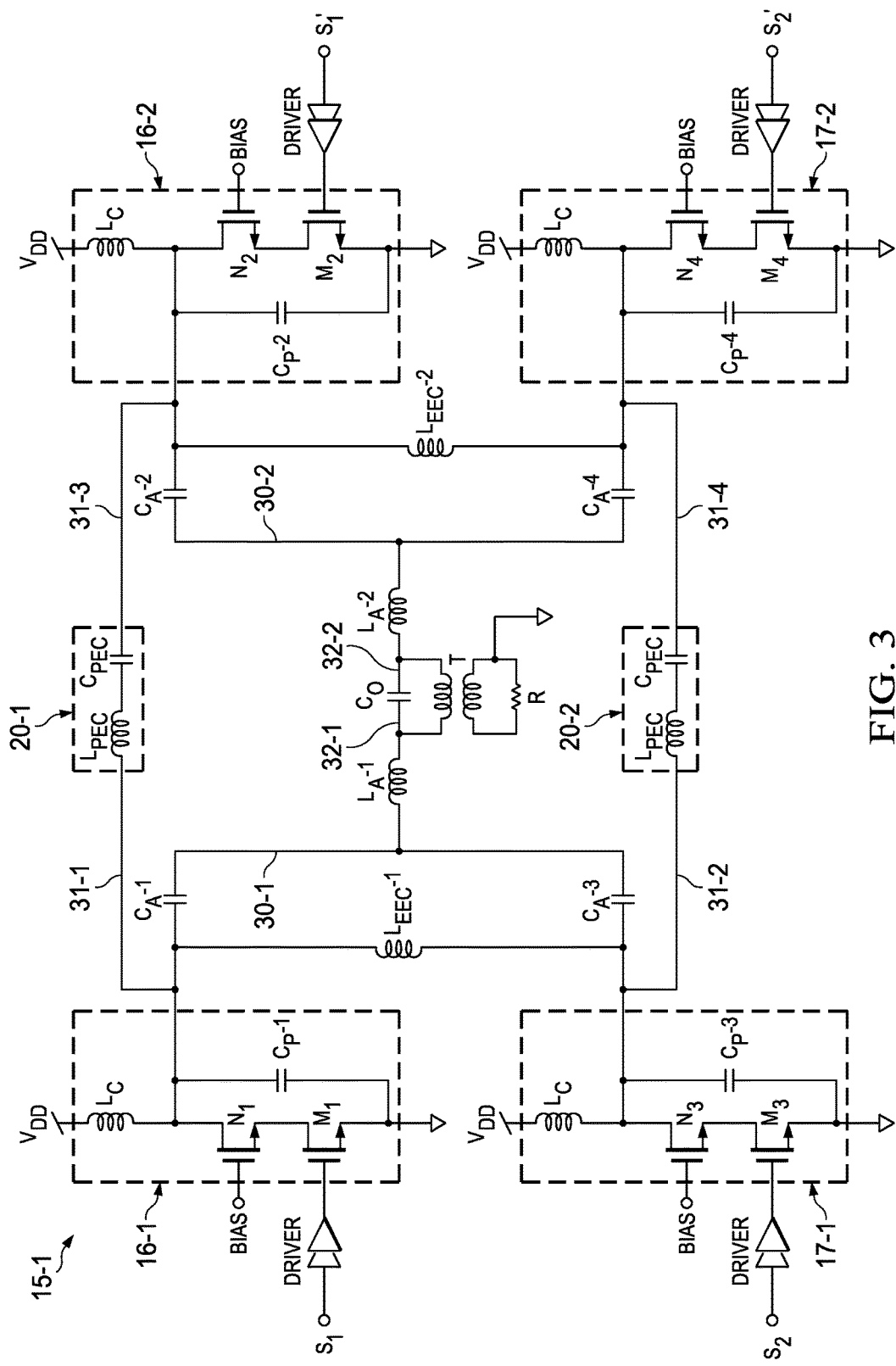
FIG. 3 is a schematic diagram of a variation of the differential class-E outphasing power amplifier of FIG. 2A further including cascode transistors, an output transformer, and an output capacitor.

The use of power enhancement circuits 20-1 and 20-2 in FIG. 3 provides a safe way of increasing the peak permissible load current and peak permissible load power by increasing the $V_{DD}$ level. In power enhancement circuits 20-1 and 20-2, $L_{PEC}$ and $L_{PEC}$ are tuned such that their resonant frequency is very close to the third harmonic of the fundamental carrier frequency. A benefit of that, for a class-E power amplifier, is that in the circuit of FIG. 3 the peak levels of the drain voltages of the cascode transistors $N_1$, $N_2$, $N_3$ and $N_4$ actually decrease. The tuned $L_{PEC}$ and $C_{PEC}$ components of power enhancement circuits 20-1 and 20-2 operate to, in effect, add their third harmonic current components to the fundamental-frequency currents of the class-E power amplifiers and thereby shift the drain voltages of the four cascode transistors $N_1$, $N_2$, $N_3$ and $N_4$ waveforms by "shaping" or "flattening" those waveforms such that their maximum levels are reduced over a wide range of values of θ. This provides a margin within which the $V_{DD}$ level can be safely increased while nevertheless maintaining the maximum peak drain voltage waveform levels within the predetermined drain-to-source voltage specifications of the input switch transistors and their associated cascode transistors. Consequently, the amount of current/power that can be safely delivered by outphasing power amplifier 15 to load resistor R is increased by simply increasing the $V_{DD}$ level.

The fundamental carrier phase angle θ between RF drive signals $S_1(t)$ and $S_2(t)$ changes as a function of the present power back-off requirement. Therefore, it is highly desirable that the above mentioned tuning of $L_{PEC}$ and $C_{PEC}$ so as to minimize the peak drain voltage be effective for all expected values of phase angle θ. In contrast, the prior art (see the above-mentioned Kee et al. reference) only discloses generating harmonic signals and adding them to a single fundamental-frequency signal to reduce the peak drain voltage of a switching transistor of a switching power amplifier without any phase modulation (as in outphasing operation).

The basic outphasing power amplifier in FIG. 2A can be modified in various ways, for example as shown in FIGS. 2B, 3, and 5-12 below, to obtain similar performance. Some of the alternative topologies require different numbers of components.

Figure 2B:
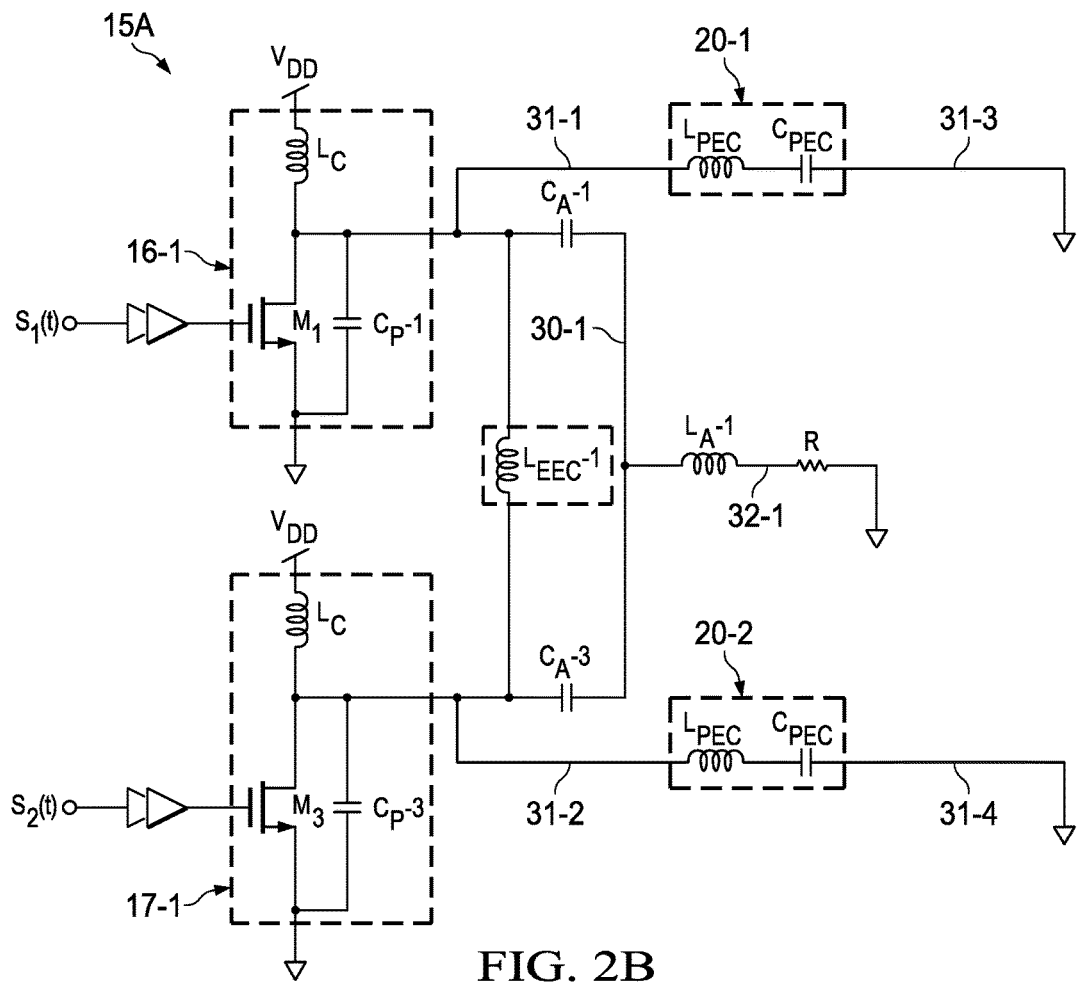
FIG. 2B is a schematic diagram of a single-ended outphasing power amplifier which consists of part of the differential implementation shown in FIG. 2A.

FIG. 2B shows a single-ended implementation of the outphasing power amplifier 15 in FIG. 2A wherein class-E power amplifiers 16-2 and 17-2, efficiency enhancement circuit $L_{EEC}$-2, capacitors $C_A$-2 and $C_A$-4, and inductor $L_A$-2 of FIG. 2A are omitted and conductors 31-3 and 31-4 are connected to ground. One terminal of load resistor R also is connected to ground.

In FIG. 3 an outphasing power amplifier 15-1 is shown which is similar to outphasing power amplifier 15 in FIG. 2A, except that in FIG. 3 the class-E power amplifier 16-1 includes a N-channel cascode transistor $N_1$ coupled between the drain of switching transistor $M_1$ and conductor 31-1 and load resistor R is replaced by a load circuit including an output capacitor $C_O$ coupled across the primary winding of a transformer T having load resistor R coupled across its secondary winding, one terminal of which is connected to ground. The benefit of the cascode structure is that higher peak output power can be obtained at the load because the drain-to-source voltage is distributed across the two transistors (the cascode transistor and the switching transistor) where the drain-to-source breakdown voltage of the cascode transistor is much higher than that of the core switching transistor.

In class-E power amplifier 16-1, the gate of switching transistor $M_1$ is coupled to receive RF drive signal $S_1(t)$ through a driver circuit. The source of switching transistor $M_1$ is connected to ground, and its drain is connected source of cascode transistor $N_1$, the drain of which is connected by conductor 31-1 to one terminal of inductor $L_C$, one terminal of capacitor $C_P$-1, one terminal of a capacitor $C_A$-1, one terminal of efficiency enhancement circuit $L_{EEC}$-1, and to one terminal of a power enhancement circuit 20-1. The gate of cascode transistor $N_1$ is connected to receive a bias voltage Bias. The other terminal of inductor $L_C$ is connected to power supply voltage $V_{DD}$. The other terminal of capacitor $C_A$-1 is connected to conductor 30-1. Power enhancement circuit 20-1 includes inductor $L_{PEC}$ and capacitor $C_{PEC}$ connected in series between conductors 31-1 and 31-3. Inductor $L_{EEC}$-1, connected between conductors 31-1 and 31-2, forms a first efficiency enhancement circuit.

In class-E power amplifier 16-2 of FIG. 3, the gate of switching transistor $M_2$ is coupled to receive RF drive signal $S_1'(t)$ through a driver circuit. The source of switching transistor $M_2$ is connected to ground, and its drain is connected to the source of cascode transistor $N_2$, the drain of which is connected by conductor 31-3 to one terminal of inductor $L_C$, one terminal of capacitor $C_P$-2, one terminal of capacitor $C_A$-2, one terminal of efficiency enhancement circuit $L_{EEC}$-2, and to one terminal of power enhancement circuit 20-1. The gate of cascode transistor $N_2$ is connected to receive the bias voltage Bias. The other terminal of inductor $L_C$ is connected to power supply voltage $V_{DD}$. The other terminal of capacitor $C_A$-2 is connected to conductor 30-2. Power enhancement circuit 20-1 includes an inductor $L_{PEC}$ and a capacitor $C_{PEC}$ connected in series between conductors 31-1 and 31-3.

In class-E power amplifier 17-1, the gate of switching transistor $M_3$ is coupled to receive RF drive signal $S_2(t)$ through a driver circuit. The source of switching transistor $M_3$ is connected to ground, and its drain is connected source of cascode transistor $N_3$, the drain of which is connected by conductor 31-2 to one terminal of inductor $L_C$, one terminal of capacitor $C_P$-3, one terminal of capacitor $C_A$-3, one terminal of the efficiency enhancement circuit $L_{EEC}$-1, and to one terminal of power enhancement circuit 20-2. The gate of cascode transistor $N_3$ is connected to receive the bias voltage Bias. The other terminal of inductor $L_C$ is connected to power supply voltage $V_{DD}$. The other terminal of capacitor $C_A$-3 is connected to conductor 30-1. Power enhancement circuit 20-2 includes inductor $L_{PEC}$ and capacitor $C_{PEC}$ connected in series between conductors 31-2 and 31-4. Inductor $L_{EEC}$-2, connected between conductors 31-3 and 31-4, forms a second efficiency enhancement circuit.

In class-E power amplifier 17-2, the gate of switching transistor $M_4$ is coupled to receive RF drive signal $S_2'(t)$ through a driver circuit. The source of switching transistor $M_4$ is connected to ground, and its drain is connected to the source of cascode transistor $N_4$, the drain of which is connected by conductor 31-4 to one terminal of inductor $L_C$, one terminal of capacitor $C_P$-4, one terminal of capacitor $C_A$-4, one terminal of the efficiency enhancement circuit $L_{EEC}$-2, and to one terminal of power enhancement circuit 20-2. The gate of cascode transistor $N_4$ is connected to receive bias voltage Bias. The other terminal of inductor $L_C$ is connected to power supply voltage $V_{DD}$. The other terminal of capacitor $C_A$-4 is connected to conductor 30-2. Power enhancement circuit 20-2 includes an inductor $L_{PEC}$ and a capacitor $C_{PEC}$ connected in series between conductors 31-2 and 31-4.

Inductor $L_A$-1 is coupled between conductor 30-1 and conductor 32-1, and inductor $L_A$-2 is coupled between conductor 30-2 and conductor 32-2. An output capacitor $C_O$ is connected between conductors 32-1 and 32-2, and the terminals of the primary winding of transformer T are connected to conductors 32-1 and 32-2, respectively. The load resistor R is connected between the terminals of the secondary winding of transformer T, one of the secondary winding terminals being connected to ground.

The cascode transistors in FIG. 3 allow higher RF voltages at the drain terminals of the cascode transistors, and this allows outphasing power amplifier 15-1 to deliver higher peak output power. By adding the power enhancement circuits 20-1 and 20-2, maximum peak voltage at the drain of the cascode device is reduced across all phase angles. In one case, this allows increasing of $V_{DD}$ by 0.4 volts without violating the allowed maximum drain-source voltage limitation. In that case, this increase in supply voltage results in a 200 milliwatt increase in the peak output power that can be delivered by the outphasing power amplifier of FIG. 3.

Figure 4A:
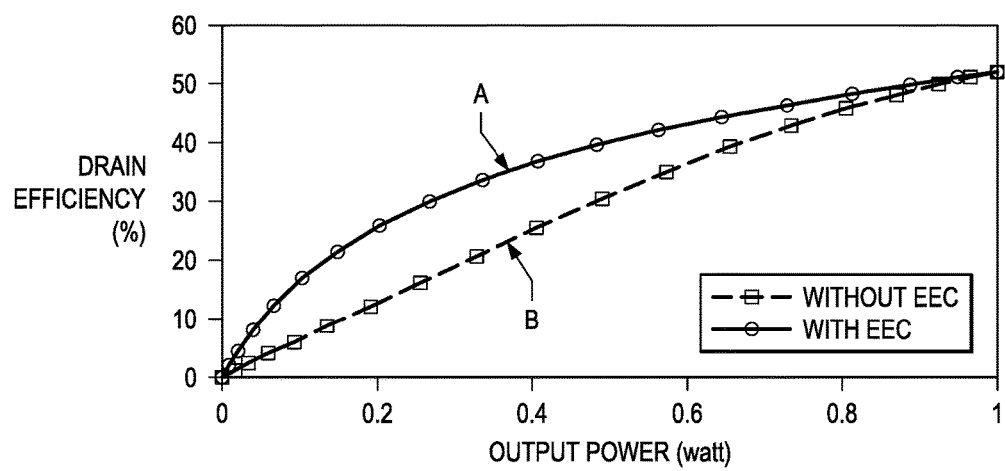
FIG. 4A is a graph illustrating efficiency versus output power for the differential class-E outphasing power amplifier of FIG. 3 with and without the efficiency enhancement circuitry.
Figure 4B:
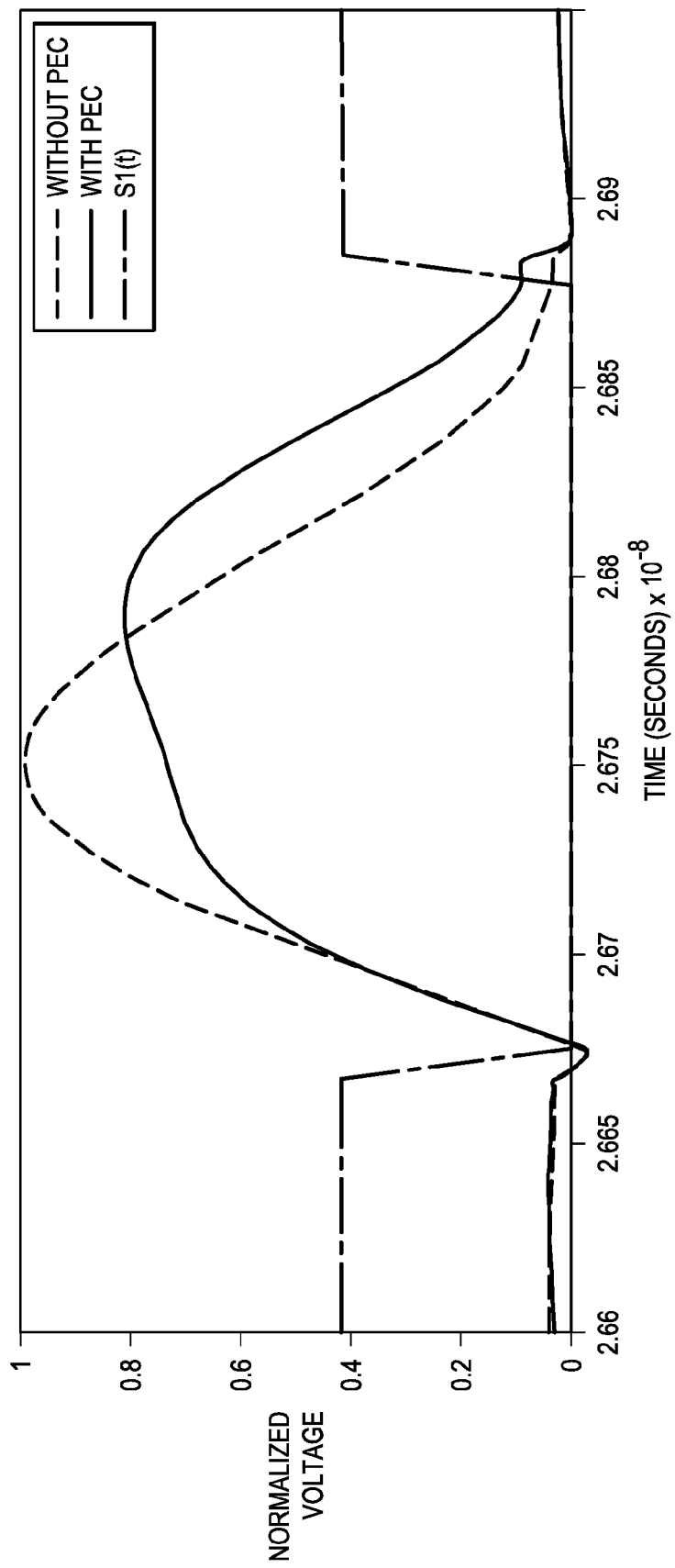
FIG. 4B is a graph illustrating switching transistor drain voltage in a class-E outphasing power amplifier with and without power enhancement circuitry.

The graph in FIG. 4A shows drain efficiency versus instantaneous output power delivered to load, with and without use of the $L_{EEC}$ efficiency enhancement circuit. The output power of the described outphasing power amplifier is increased by reducing the phase angle θ between the $S_1(t)$ and $S_2(t)$ vectors. The addition of the $L_{EEC}$ inductor improves the power efficiency of the outphasing power amplifier during large power back-off conditions, as indicated by curve "A" in the graph of FIG. 4A. If the phase angle θ between the $S_1(t)$ and $S_2(t)$ vectors is increased, the output power is decreased and the outphasing power amplifier's power efficiency falls sharply without the $L_{EEC}$ efficiency enhancement circuit, as indicated by curve "B". The graph of FIG. 4B shows drain voltage in a class-E outphasing power amplifier with and without power enhancement circuitry. The drain voltage is "flattened" by adding the power enhancement circuitry.

Figure 5:
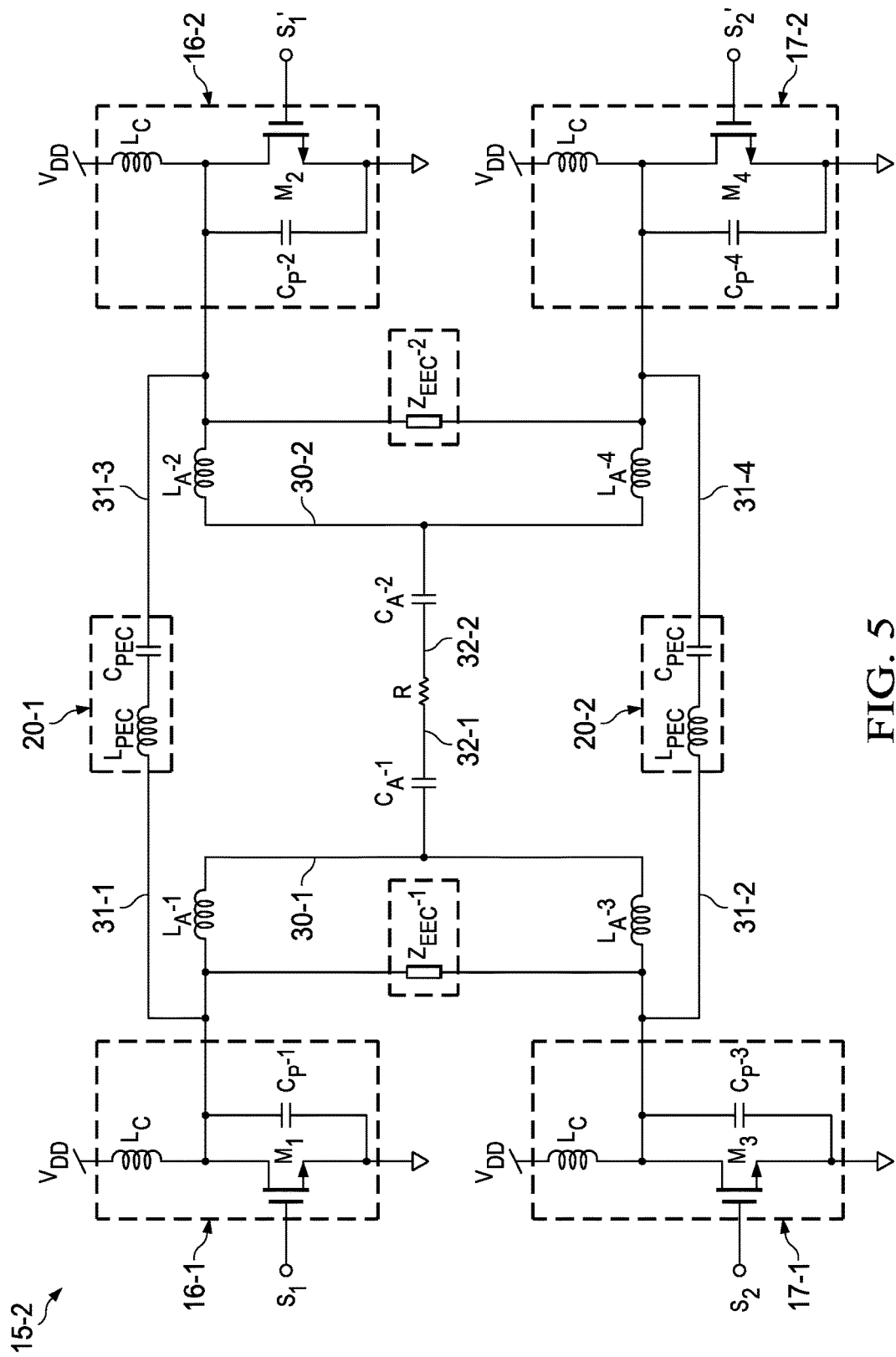
FIG. 5 is a schematic diagram of another variation of the differential class-E outphasing power amplifier of FIG. 2A wherein the locations of the various "$C_A$ capacitors" and "$L_A$ inductors" have been interchanged.

FIG. 5 is similar to FIG. 2A, except that in outphasing amplifier 15-2 of FIG. 5 the locations of the various "$C_A$ capacitors" and "$L_A$ inductors" have been interchanged. Specifically, inductor $L_A$-1 is connected between conductor 31-1 and conductor 30-1, and capacitor $C_A$-1 is connected between conductor 30-1 and conductor 32-1. Also, inductor $L_A$-3 is connected between conductor 31-2 and conductor 30-1. Similarly, inductor $L_A$-2 is connected between conductor 31-3 and conductor 30-2, and capacitor $C_A$-2 is connected between conductor 30-2 and conductor 32-2. Inductor $L_A$-4 is connected between conductor 31-4 and conductor 30-2. The values of the "$L_A$ inductors" and the "$C_A$ capacitors" are different in this case compared to their values in FIGS. 2A and 3. In FIG. 5, the efficiency enhancement circuits $Z_{EEC}$-1 and $Z_{EEC}$-2 may be either capacitive or inductive, depending on the values of the "$C_P$ capacitors" and the "$L_A$ inductors", so as to provide high-impedance parallel resonant circuits. Also, the efficiency enhancement circuits $Z_{EEC}$-1 and $Z_{EEC}$-2 in FIGS. 7-8 may be either capacitive or inductive.

Figure 6:
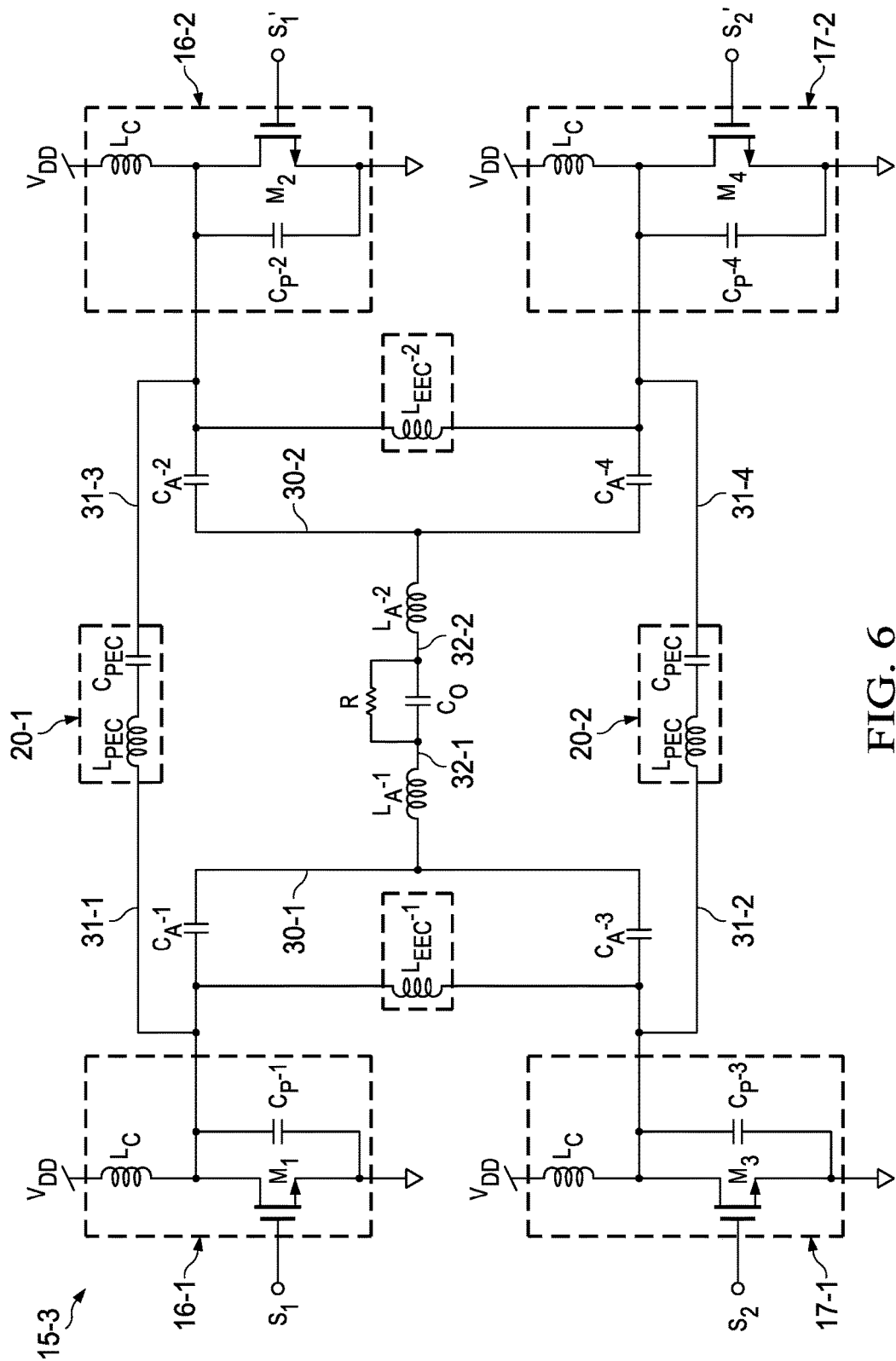
FIG. 6 is a schematic diagram of another variation of the differential class-E outphasing power amplifier of FIG. 2A.

In FIG. 6, outphasing power amplifier 15-3 has a configuration somewhat similar to that of FIG. 2A. The output circuit is different in this case and includes output capacitor $C_O$ connected between conductors 32-1 and 32-2 in parallel with load resistance R. The output capacitor is part of the matching network and is used for transforming a 50 ohm load impedance to a lower value at the output of the individual PAs for the purpose of maximizing power transfer.

Figure 7:
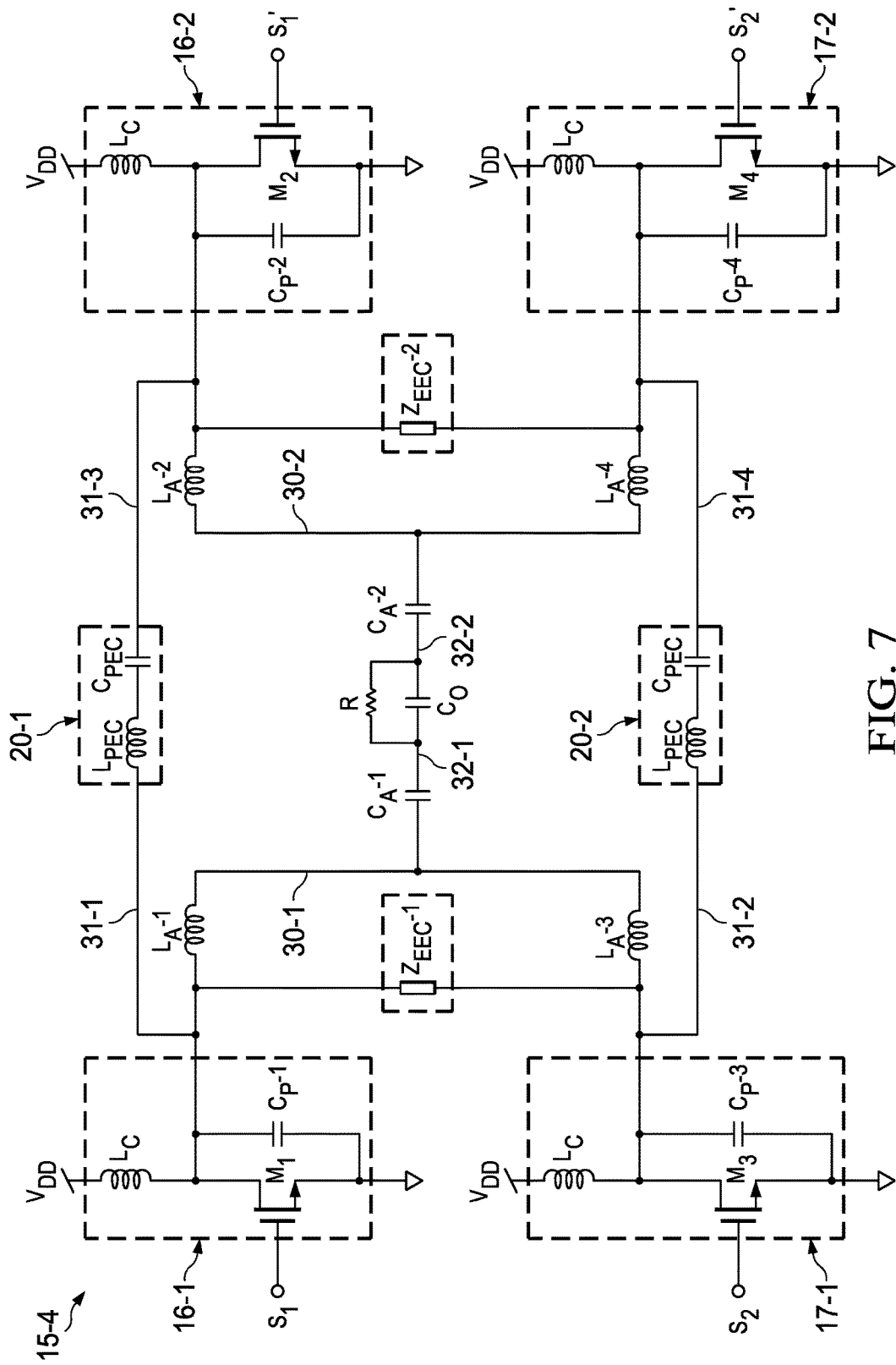
FIG. 7 is a schematic diagram of another variation of the differential class-E outphasing power amplifier of FIG. 2A.

In outphasing power amplifier 15-4 of FIG. 7, the locations of the "$L_A$ inductors" and the "$C_A$ capacitors" have been reversed relative to FIG. 6. The outphasing power amplifier in FIG. 6 has a lower number of inductors and is easier to implement in integrated circuits compared to the outphasing power amplifier in FIG. 7. (Note that FIGS. 2A, 5, 6, and 7 show various combinations of the locations of the "$C_A$ capacitors" and the "$L_A$ inductors" with and without the output capacitor $C_O$.)

Figure 8:
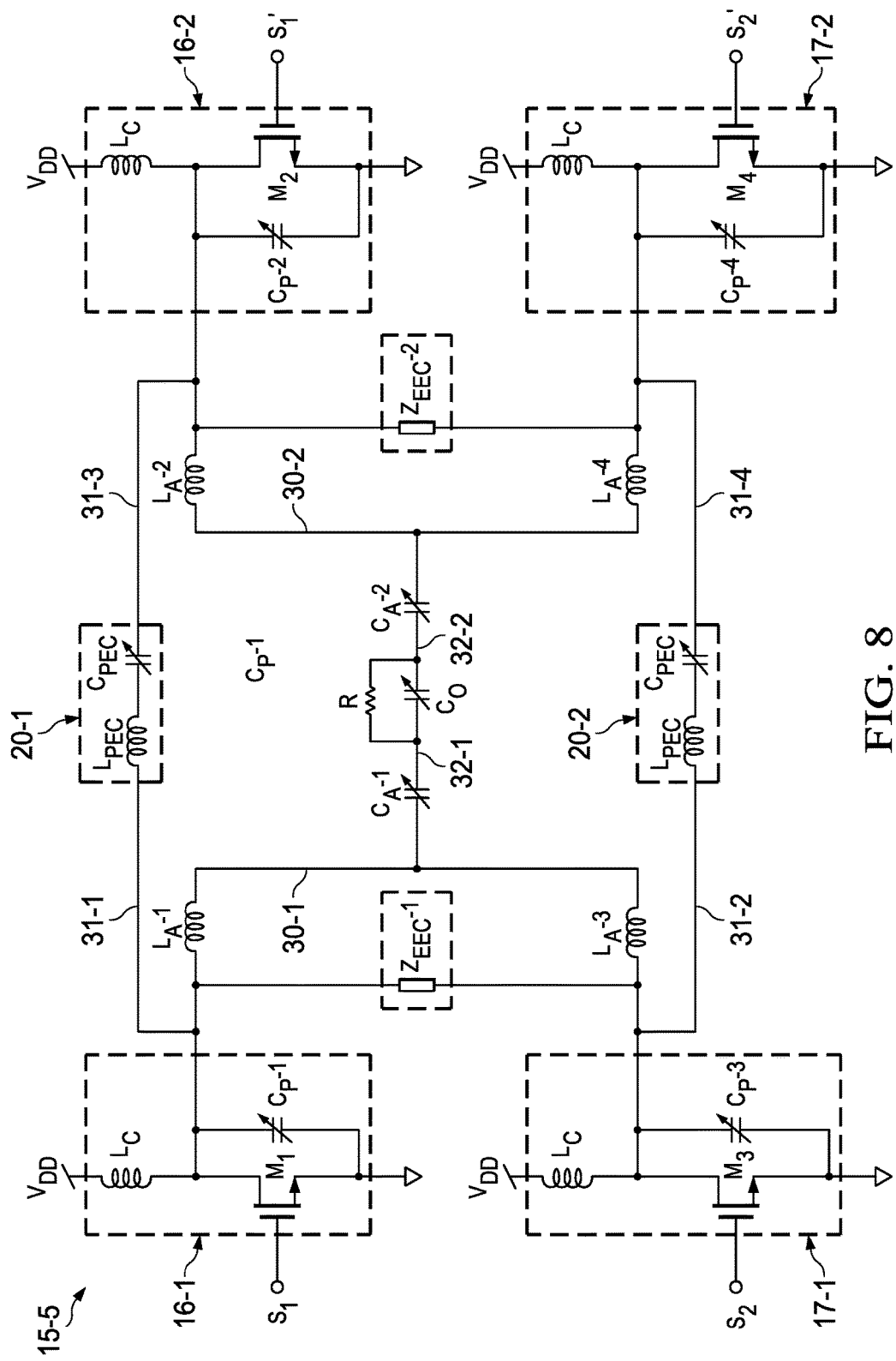
FIG. 8 is a schematic diagram of a tunable variation of the differential class-E outphasing power amplifier of FIG. 2A.

In outphasing power amplifier 15-5 of FIG. 8, the circuit connections are the same as in FIG. 7 except that all of the "$C_A$ capacitors", "$C_P$ capacitors", "$C_{PEC}$ capacitors", and the output capacitor $C_O$ are tunable. The tunable capacitors make it practical to compensate for the effects of manufacturing process variations and also make it practical to tune for different center frequencies or carrier frequencies of the RF drive signals $S_1(t)$ and $S_2(t)$. The reason that the tunability is desirable is that in a practical scenario the actual components (inductor, capacitor, resistor, etc.) values typically may vary from their nominal design values due to manufacturing process variation. That variation can cause undesired change in circuit performance and/or other undesired circuit problems. The "tunability" of certain capacitances allows the integrated circuit to be adjusted after fabrication so as to compensate for the above indicated "process variation" in component parameters. (Note that tuning capacitors also can be provided for the other described embodiments of the present invention. The tunable capacitors can be implemented by varactors or parallel capacitors connected by switches and switching them on and off from the circuit to control the effective capacitance.)

Figure 9:
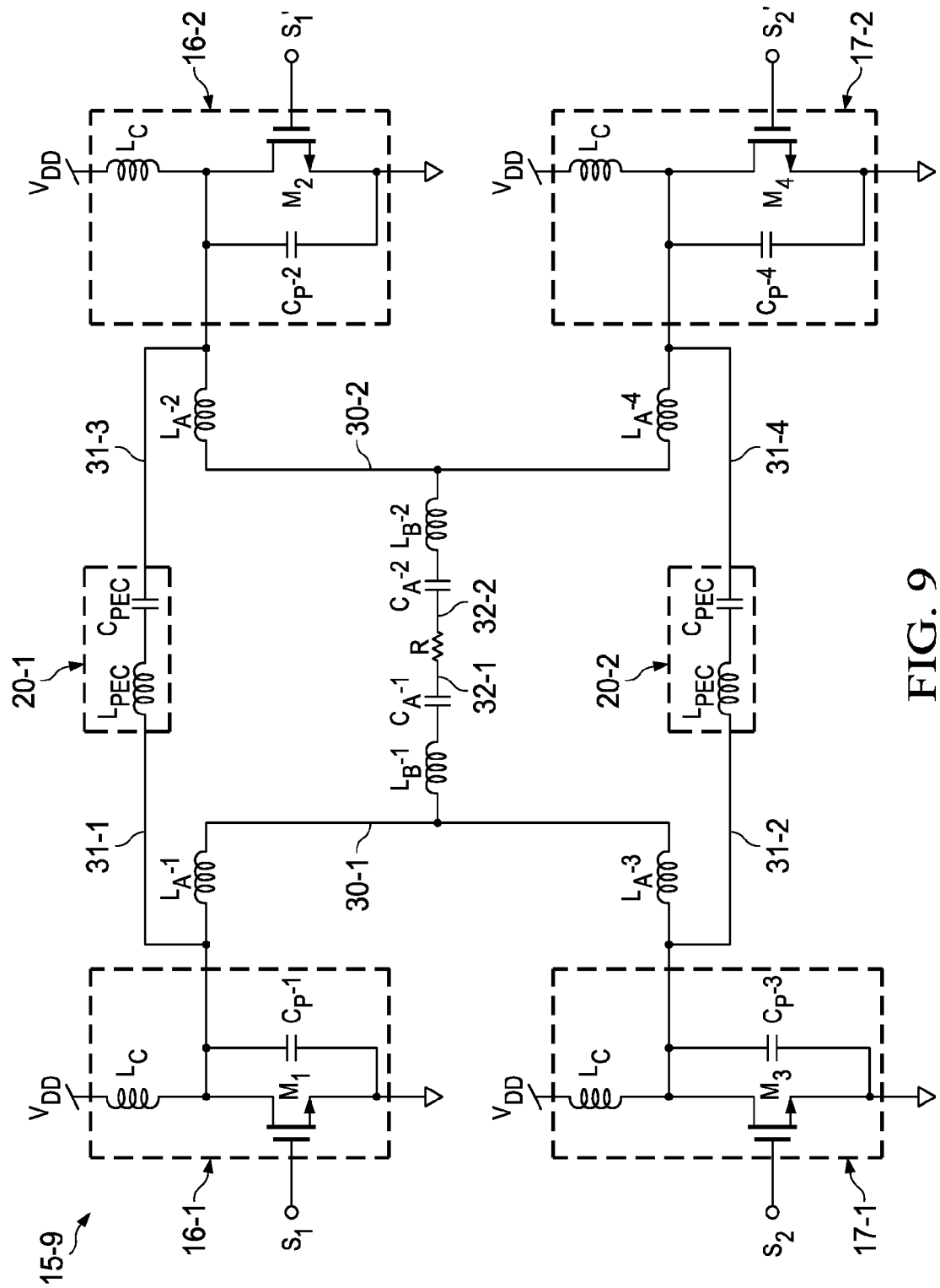
FIG. 9 is a schematic diagram of another variation of the differential class-E outphasing power amplifier of FIG. 2A.

In outphasing power amplifier 15-9 of FIG. 9, the basic circuit configuration is similar to that in FIG. 7 except the efficiency enhancement circuits are implemented by $L_A$ inductors. Power enhancement circuit 20-1 is connected between conductors 31-1 and 31-3, and power enhancement circuit 20-2 is connected between conductors 31-2 and 31-4, as shown in FIG. 9. Inductors $L_A$-1, $L_A$-2, $L_A$-3, and $L_A$-4, inductors $L_B$-1 and $L_B$-2, and capacitors $C_A$-1 and $C_A$-2 are connected as shown in FIG. 9. However, the efficiency enhancement circuit function, in addition to the class-E output signal combining function is performed by the above-mentioned components shown in outphasing power amplifier 15-9. For out-of-phase components of $S_1(t)$ and $S_2(t)$, the $L_A$ inductors with the $C_P$ capacitors form parallel resonant circuits and provide high impedance at fundamental frequency and reduce the out-of-phase current and thereby perform the efficiency enhancement function. The $L_A$ and $L_B$ inductors and $C_A$ capacitors form the class-E tuned combiner circuit. The inductors are "split" as the $L_A$ and $L_B$ inductors such that the $L_A$ inductors perform the efficiency enhancement function and the $L_A$ and $L_B$ inductors together provide the required combiner circuit inductance.

Still referring to FIG. 9, it should be understood that for out-of-phase components of $S_1(t)$ and $S_2(t)$, there is a virtual ground at the at the left terminal 30-1 of inductor $L_B$-1. Consequently, capacitor $C_P$-1 and inductor $L_A$-1 are effectively coupled in parallel. The inductance of $L_A$-1 is such that it resonates with capacitor $C_e$-1 to provide a high impedance parallel resonant network at the carrier frequency of RF drive signals $S_1(t)$ and $S_2(t)$. (This could not be accomplished in the above-described embodiments of the invention because the value of inductor $L_A$-1 is determined by the various design parameter values chosen for the combiner circuitry which adds the four class-E power amplifier output signals in order to generate the output voltage across the load resistor R. Consequently, the circuit designer does not have the flexibility to choose the value of inductor $L_A$-1 such that it can contribute to the "efficiency enhancement function" in addition to performing the power amplifier output signal combining function. However, in outphasing power amplifier 15-9 of FIG. 9, the circuit designer does have the flexibility to choose the value of inductor $L_A$-1 in such a way as to provide both the efficiency enhancement function and the power amplifier output signal combining function with class-E operation, because for the combining function the value of inductor $L_B$-1 can be added with the value of inductor $L_A$-1. (This is also true for the other $L_A$ inductors.)

Figure 10:
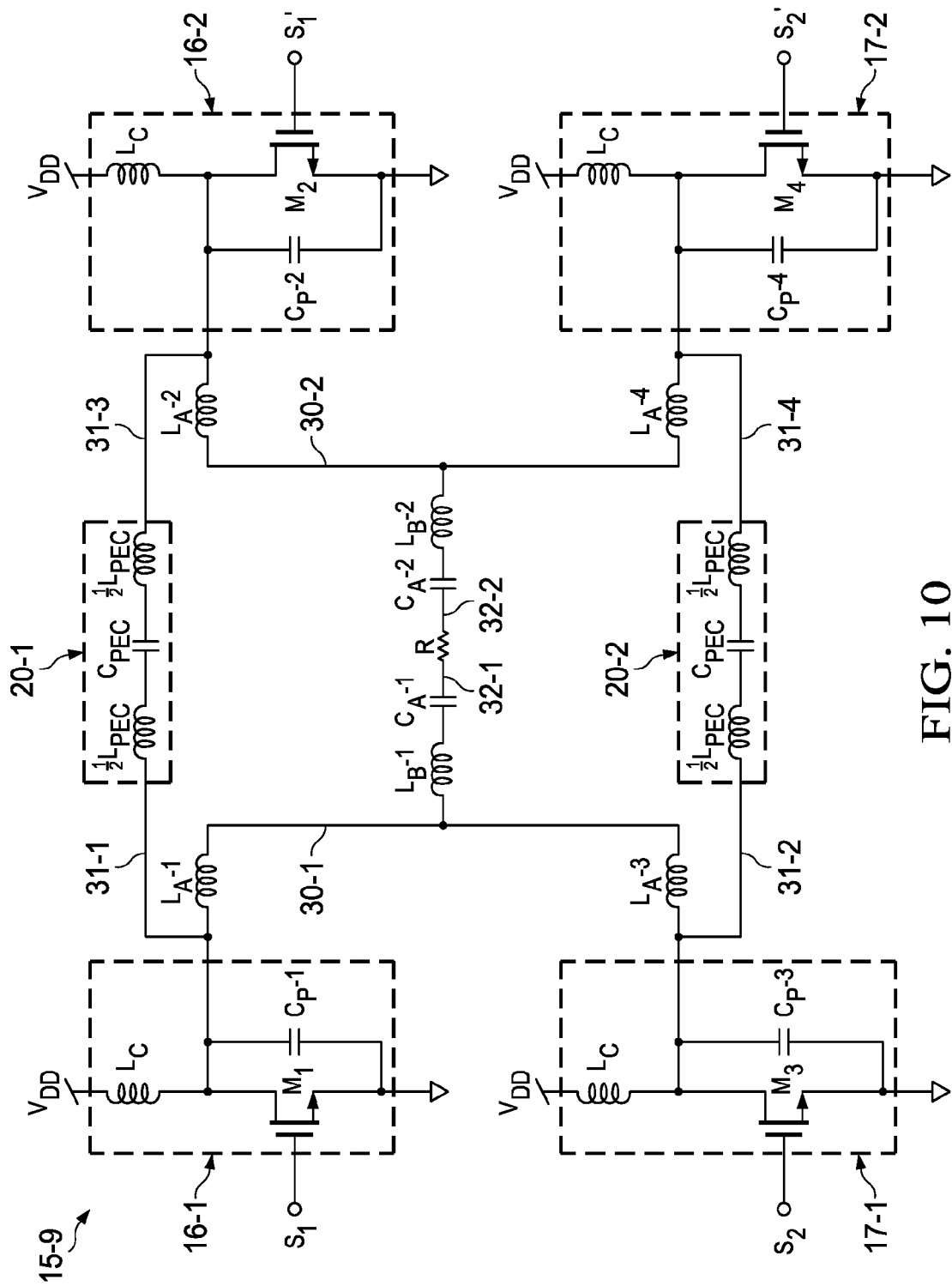
FIG. 10 is a schematic diagram of another variation of the differential class-E outphasing power amplifier of FIG. 2A.

FIG. 10 shows a variation which is the same as the outphasing power amplifier 15-9 of FIG. 9 except that in each of the power enhancement circuits 20-1 and 20-2 of FIG. 10, each of the single inductors $L_{PEC}$ has been "split" into two separate inductors each having an inductance equal to $L_{PEC}/2$. In power enhancement circuit 20-1, one of the two $L_{PEC}/2$ inductors is connected between conductor 31-1 and one terminal of the $C_{PEC}$ capacitor and the other $L_{PEC}/2$ inductor is connected between conductor 31-3 and the opposite terminal of the $C_{PEC}$ capacitor. Similarly, in power enhancement circuit 20-2, one of the $L_{PEC}/2$ inductors is connected between conductor 31-2 and one terminal of the $C_{PEC}$ capacitor and the other $L_{PEC}/2$ inductor is connected between conductor 31-4 and the other terminal of the $C_{PEC}$ capacitor. Note that in FIG. 10 the drains of the switching transistors $M_1$, $M_2$, $M_3$ and $M_4$ all are coupled to inductors. One benefit of this configuration is that if the switching transistors are implemented "on-chip" and the elements of the combiner are implemented using external ("off-chip") discrete components, then the inductors of the combiner can be implemented by bond wire inductance or the bond wire inductors can be in effect "absorbed" by the external inductors.

The above described embodiments of the invention have the advantages of providing improvement in power efficiency, improvement in achievable peak output power levels, and ease of implementation.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, more cascode transistors can be "stacked" in series in any of the described embodiments of the invention if needed to allow $V_{DD}$ to be increased, and thereby increase the amount of peak power that can be safely delivered to the load by outphasing power amplifier without exceeding the power transistor breakdown specifications. In any of the disclosed embodiments of the invention, an output capacitor can be coupled by a transformer to the load driven by the outphasing power amplifier.

What is claimed is:

1. An outphasing amplifier comprising:
   (a) a first class-E power amplifier having an output at a node where a choke inductor is coupled with a first switching device, the output being coupled to a first conductor and an input coupled to a first RF drive signal, a first reactive circuit element coupled between the first conductor and a second conductor and a second reactive circuit element coupled between the second conductor and a third conductor; and
   (b) a second class-E power amplifier having an output at a node where a choke inductor is coupled with a second switching device, the output being coupled to a fourth conductor and an input coupled to a second RF drive signal, a third reactive circuit element coupled between the fourth conductor and the second conductor, the third conductor being coupled to a first terminal of a load, outputs of the first and second class-E power amplifiers being combined by means of the first, second, and third reactive elements to produce an output current in the load.

2. The outphasing amplifier of claim 1 wherein the first reactive circuit element and the third reactive circuit element are included in circuitry which also performs an efficiency enhancement function.

3. A method for providing an outphasing power amplifier including a first class-E power amplifier having an output at a node where a choke inductor is coupled with a first switching device, the output being coupled to a first conductor and an input coupled to a first RF drive signal and a second class-E power amplifier having an output at a node where a choke inductor is coupled with a second switching device, the output being coupled to a fourth conductor and an input coupled to a second RF drive signal, the method comprising combining output signals produced by the first and second power amplifiers by:
   (a) coupling a first reactive circuit element between the first conductor and a second conductor;
   (b) coupling a second reactive circuit element between the second conductor and a third conductor; and
   (c) coupling a third reactive circuit element between the fourth conductor and the second conductor, to produce an output current in a load.

4. The method of claim 3 including performing an efficiency enhancement function by means of the first and third reactive circuit elements.

* * * * *